(12) United States Patent
Xiong et al.

(10) Patent No.: US 9,680,278 B2
(45) Date of Patent: Jun. 13, 2017

(54) SEMICONDUCTOR OPTICAL CRYOCOOLER

(71) Applicant: Nanyang Technological University, Singapore (SG)

(72) Inventors: Qihua Xiong, Singapore (SG); Jun Zhang, Singapore (SG); Dehui Li, Singapore (SG)

(73) Assignee: NANYANG TECHNOLOGY UNIVERSITY, Singapore (SG)

( * ) Notice: Subject to any disclaimer, the term of this patent is extended or adjusted under 35 U.S.C. 154(b) by 716 days.

(21) Appl. No.: 13/911,825

(22) Filed: Jun. 6, 2013

(65) Prior Publication Data

US 2013/0336348 A1    Dec. 19, 2013

Related U.S. Application Data

(60) Provisional application No. 61/656,185, filed on Jun. 6, 2012.

(51) Int. Cl.
| | |
|---|---|
| F25D 23/00 | (2006.01) |
| F25B 21/00 | (2006.01) |
| F25D 23/12 | (2006.01) |
| H01S 3/04 | (2006.01) |
| H01L 23/34 | (2006.01) |

(52) U.S. Cl.
CPC .............. H01S 3/04 (2013.01); H01L 23/34 (2013.01); *H01L 2924/0002* (2013.01)

(58) Field of Classification Search
CPC ...... F25B 21/00; F25B 23/003; H01S 3/0408; H01S 3/04

USPC .............................. 372/7; 62/264, 3.1, 259.2
See application file for complete search history.

(56) References Cited

U.S. PATENT DOCUMENTS

| | | | | |
|---|---|---|---|---|
| 4,580,269 A | * | 4/1986 | Salour | H01S 5/14 372/36 |
| 5,615,558 A | * | 4/1997 | Cornell | F25B 23/003 62/264 |
| 6,378,321 B1 | * | 4/2002 | Epstein | F25B 21/00 257/E23.08 |
| 8,680,955 B1 | * | 3/2014 | Hammond | B81B 7/0019 200/181 |
| 2011/0212512 A1 | * | 9/2011 | Wang | B82Y 20/00 435/288.7 |

OTHER PUBLICATIONS

Chattopadhyay et al., "Study of CdSSe:V and CdMnTe:V Photorefractive Effect," 1999, Journal of Electronic Materials, vol. 28, No. 6.*

* cited by examiner

*Primary Examiner* — Ryan J Walters
*Assistant Examiner* — Joseph Trpisovsky
(74) *Attorney, Agent, or Firm* — Sughrue Mion, PLLC

(57) ABSTRACT

There is provided a laser cooling apparatus including: a laser for providing an emission; a silicon-on-insulator substrate; and a thin film microstructure thermally anchored to the silicon-on-insulator substrate, the thin film microstructure being made from a material selected from either a II-VI binary compound semiconductor or a II-VI tenary compound semiconductor.

13 Claims, 16 Drawing Sheets

SEMICONDUCTOR OPTICAL CRYOCOOLER

FIELD OF INVENTION

The present invention relates to the field of cooling matter using laser emission.

BACKGROUND

The background of the present invention will be described in a manner which refers to a list of references that is provided before the claims section of the present application.

Laser irradiation has been used for the cooling of matter such as, for example, dilute gases and solids. For gaseous matter, an extremely low temperature in diluted atomic gases can be obtained by Doppler cooling leading to the observation of Bose-Einstein condensates[1,2]. Recently, laser cooling of ultra-dense gas has been demonstrated by collisional redistribution of radiation[3]. For solid matter, laser cooling of solids (ie. optical refrigeration), which was proposed in the 1930s by Pringsheim[4-6], achieves cooling by the annihilation of phonons and quanta of lattice vibrations during anti-Stokes luminescence.

Optical refrigeration exhibits advantages such as, for example, compactness, lack of vibration, cryogen-free, high reliability[7] and so forth. Applications include, for example, an all-solid-state cryocooler[8], and an athermal/self-cooling laser[7]. However, optical refrigeration requires special high purity materials with appropriately spaced energy levels and a high emission efficiency which explains why optical refrigeration research has been confined to the rare-earth doped glasses and direct band semiconductors.

Laser cooling of rare-earth doped glasses has been demonstrated in a rare earth-metal-fluoride glass (ZBLANP) doped with trivalent ytterbium ions by Epstein[9]. Since then, progress has been made particularly in ytterbium-doped glass with a recent record of ~155 K cooling from an ambient temperature, surpassing a performance of a thermoelectric Peltier cooler[10]. However, cooling cycles typically stop around 100 K in rare-earth doped glasses because high energy levels in a ground state manifold become depopulated owing to Boltzmann statistics[5].

Excitonic resonances dominate[11-13] for laser cooling of semiconductors. The laser cooling of direct band gap semiconductors like GaAs[14-17], is interesting as semiconductors exhibit efficient pump light absorption, low achievable cooling temperature and integrate-ability into electronic and photonic devices. Furthermore, it is possible for semiconductors to be cooled to below 10 K since carriers obey Fermi-Dirac statistics, which keeps the lower energy valence band still be populated[5, 13, 18]. Although several experimental[15-17] and theoretical[11-13,19,20] works (typically on GaAs quantum wells) have been discussed, no net-cooling has been achieved in semiconductors. This is because of high parasitic background absorption and poor luminescence extraction efficiency, even though anti-Stokes up-conversion can be readily achieved[13-15, 17].

SUMMARY

There is provided a laser cooling apparatus including: a laser for providing an emission; a silicon-on-insulator substrate; and a thin film microstructure thermally anchored to the silicon-on-insulator substrate, the thin film microstructure being made from a material selected from either a II-VI binary compound semiconductor or a II-VI tenary compound semiconductor.

The thin film microstructure is configured to provide high emission extraction in an absence of reabsorption, and may be in a form of, for example, nanobelts, crystalline thin film, bulk crystal and the like. The II-VI binary compound semiconductor may be cadmium sulfur, cadmium selenide, cadium telluride, zinc sulfur, zinc selenide, zinc telluride and the like. The II-VI tenary compound semiconductor may be $CdS_xSe_{1-x}$, $CdS_xTe_{1-x}$, $CdSe_xTe_{1-x}$, $ZnS_xSe_{1-x}$, $ZnS_xTe_{1-x}$, and $ZnSe_xTe_{1-x}$ and the like.

Preferably, the silicon-on-insulator substrate is patterned with grids by e-beam lithography, and etched by reactive ion etching. In addition, the laser may have a wavelength below a bandgap of the II-VI binary compound and may have a power rating of less than 12 mW.

There is also provided a nano-electric device and an optoelectric device using the aforementioned laser cooling apparatus There is also provided a method for carrying out laser cooling. The method includes thermal anchoring a thin film microstructure to a silicon-on-insulator substrate, the thin film microstructure being made from a material selected from either a II-VI binary compound semiconductor or a II-VI tenary compound semiconductor; and irradiating the thin film microstructure with a laser.

The method may further include patterning the silicon-on-insulator substrate with grids using e-beam lithography, and etching by reactive ion etching. The thin film microstructure is of a form such as, for example, nanobelts, crystalline thin film, bulk crystal and so forth.

DESCRIPTION OF FIGURES

In order that the present invention may be fully understood and readily put into practical effect, there shall now be described by way of non-limitative example only preferred embodiments of the present invention, the description being with reference to the accompanying illustrative figures.

DESCRIPTION OF PREFERRED EMBODIMENTS

The preferred embodiments of the present invention will also be described in a manner which refers to a list of references that is provided before the claims section of the present application.

Figure 1:
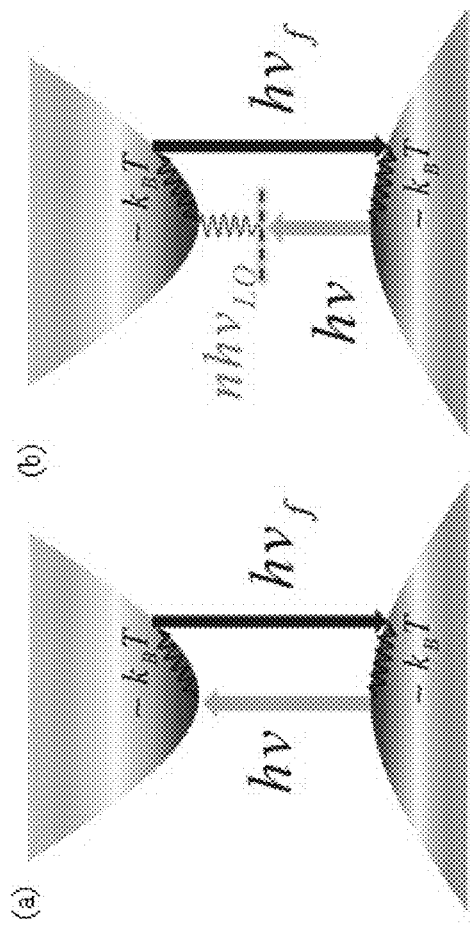
FIG. 1 shows schematic diagrams of cooling for classical Pringsheim scenario and a modified form as per the present invention.

FIG. 1(a) shows a schematic diagram for a cooling cycle for a classical Pringsheim scenario, while FIG. 1(b) shows a schematic diagram for a modification to FIG. 1(a), the modification leading to multiple LO phonon assisted anti-Stokes PL up-conversion. The pump laser energy is hv and the mean emission energy is $hv_f$.

The mechanism in the present invention is different from the classical Pringsheim scenario. In the classical Pringsheim scenario, both to rare-earth doped glasses[9, 10] and GaAs[12, 13], each cooling cycle removes $\Delta E = h\overline{v}_f(T) - hv \sim k_B T$ during the thermalization of cold electrons and holes as shown in FIG. 1(a). A modification as shown in FIG. 1(b) significantly increases the energy difference $\Delta E$, the resonant annihilation of multiple longitudinal optical (LO) phonons which can be facilitated by strong electron-LO coupling before further thermalization. As a result, each cooling cycle removes $nhv_{LO} + k_B T$ (n≥1) energy from the matter.

Apart from the large energy difference $\Delta E$ due to the revised cooling cycle picture, the small thickness of the nanobelts provides the large emission extraction efficiency due to the absence of the reabsorption. In contrast, the re-absorption in bulk materials gives rise to the redshift of the mean emission energy because the structures with a thickness larger than the half wavelength of the emitted light inside the structures would trap emitted photons which could be absorbed again. This nano-scale cooler should be expected to find wide applications in the field of the nanotechnology.

In addition to providing net cooling in semiconductors, the cooling of the silicon-on-insulator (SOI) substrates is also provided. This may lead to applications in the field of cryogenics with the advantage of compactness, vibration/cryogen-free, high reliability and direct integrability into nanoscale electronic and photonic devices.

The present invention demonstrates net laser cooling in thin film microstructure semiconductors. Thin film microstructures can be nanobelts (also commonly known as nanoribbons), crystalline thin film or thin layer of bulk materials. Nanobelts are "ribbon-like" structures with a few to hundreds of micrometers in length, a few micrometers in width, 1-500 nm in thickness. Crystalline thin film refers to crystalline blanket coverage on top of a substrate, with infinite (for instance, wafer scale or limited by substrate) size, but a few nanometer to hundreds of nanometers; while thin bulk crystal refers to thin sample with nanometer to micrometer thick sample prepared from a 3D crystals. Hence, bulk crystals are usually grown in millimetres to tens of centimetres.

One of the possible materials that can be used is cadmium sulfur (CdS). High crystalline quality CdS nanobelts are obtained using a physical vapor transport method. Strong electron-phonon interaction is confirmed using Raman scattering and anti-Stokes up-conversion luminescence spectra. The strong electron-phonon interaction causes strong anti-Stokes up-conversion luminescence, which is crucial to the laser cooling.

Investigation of the electron-phonon interaction in the CdS nanobelts and of temperature/wavelength dependent anti-Stokes luminescence is carried out in order to determine a wavelength range at a particular temperature for carrying out laser cooling. It is determined that the net laser cooling can take place in a range from 4 K to 340 K for a 532 nm laser while the net laser cooling can only take place above 180 K for a 514 nm laser. For lasers with wavelengths less than 502 nm, no net laser cooling can take place.

Subsequently, the laser cooling of CdS nanobelts using pump-probe luminescence thermometry is carried out. It is determined that net laser cooling can be carried out at room temperature using 532 nm and 514 nm lasers while net laser cooling can only be carried out at 100 K using a 532 nm laser.

In addition, proof-of-concept is evidenced using an all-solid semiconductor cryocooler based on a CdS/silicon-on-insulator (SOI) structure to cool other thermal loads like an SOI substrate that is thermally anchored to the CdS nanobelt. Other II-VI group thin film semiconductors are also tested in relation to laser cooling, such as, for example, ZnTe, ternary alloy $CdS_xSe_{1-x}$ and the like. Finally, the possibility and problems of laser cooling for bulk crystals is also assessed.

Figure 2:
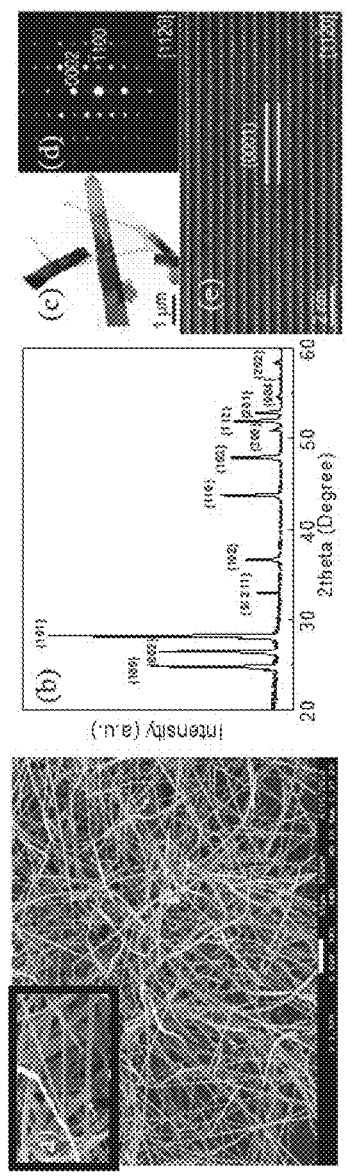
FIG. 2 shows a series of images relating to physical properties of an as-grown cadmium sulfur (CdS) nanobelt.

FIG. 2 discloses a series of images relating to physical properties of a CdS nanobelt which was grown in a manner as described in this paragraph. CdS powders (Alfa Aesar, purity: 99.99%) were contained in a quartz boat which was placed at the center of a quartz tube. A Si substrate dispersed with 30 nm Au nanoparticles was placed at the downstream of the source material. After the quartz tube was pumped down to a base pressure of 10 mTorr, a carrier gas of 30 sccm H2 was introduced. The source material was heated up to 850° C. at a rate of 85° C./min and was maintained at this temperature for 30 minutes. The pressure was kept 20 Torr during the whole process. The as-grown nanobelts were bright yellow in color.

An SEM image of the as-grown CdS nanobelts is shown in FIG. 2(a). A boxed out portion of FIG. 2(a) shows a zoomed-in portion of the as-grown CdS nanobelts. The nanobelts were characterized by X-ray diffraction (XRD, with Cu Kα=0.15419 nm; Bruker D8 Advance diffractometer), field emission scanning electron microscope (FESEM, JEOL JSM-7001 F), transmission electron microscopy (TEM, JEM-200CX), and high resolution transmission electron microscopy (HRTEM, JEOL-2010F). The width and the length of the nanobelts are several microns and tens of microns, respectively. Atomic force microscopy (AFM) characteristic shows that the thickness of the nanobelts ranges from 30 nm to approximately 200 nm.

FIG. 2(b) shows an x-ray diffraction spectrum of the as-grown CdS nanobelt. The data depicted in FIG. 2(b) suggests that CdS nanobelts exhibit wurtzite structure (JCPDS: 77-2306) with a good crystalline quality. FIG. 2(c) shows a typical low-magnification TEM image of the CdS nanobelt. FIG. 2(d) shows a selected area electron diffraction (SAED) pattern of the CdS nanobelt which also denotes a good crystalline quality. FIG. 2(e) shows a high-resolution transmission electron microscopy (HRTEM) image of the CdS nanobelt which clearly indicates the two-dimensional lattice fringes consisting of (0001) and (−1100) planes, which denotes that the growth for the CdS nanobelts in a perpendicular direction to the (−1100) plane.

The principle behind use of the CdS nanobelt samples is different from Pringsheim as applied both to RE doped glasses[9, 10] and GaAs[12, 13]. Each cooling cycle removes $nh\nu_{LO}+k_BT$ (n≥1) of energy from the matter in the present invention. This is supported by the analysis of Stokes/anti-Stokes Raman intensity and the electron-LO phonon coupling strength in CdS nanobelts.

Figure 3:
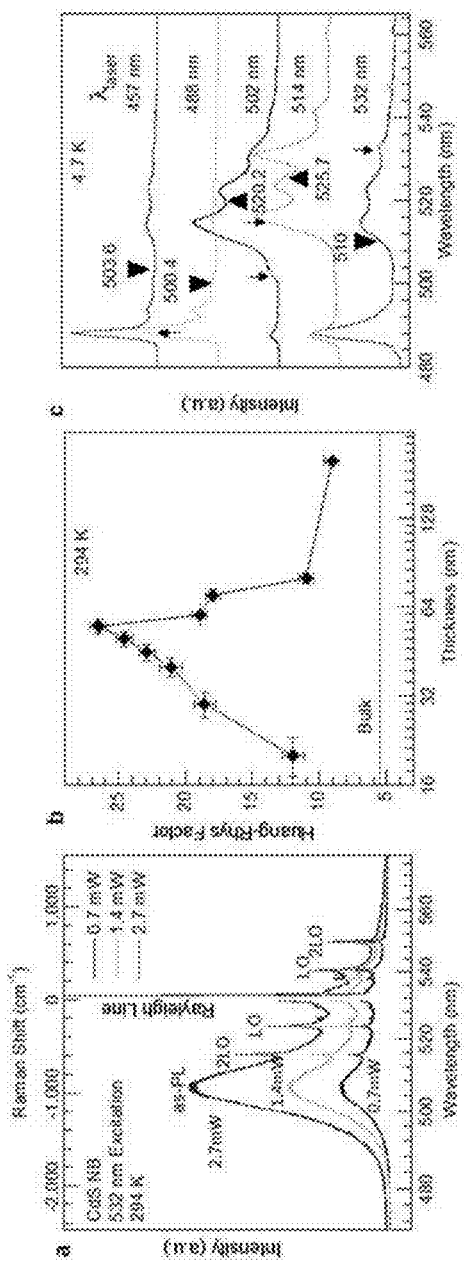
FIG. 3 shows a series of images relating to coupling strength of the as-grown CdS nanobelt.

FIG. 3 shows a series of images relating to coupling strength of the as-grown CdS nanobelt. FIG. 3(a) shows the anti-Stokes photoluminescence (PL) spectra of the CdS nanobelt excited by a 532 nm laser at three power levels at 294 K. Strong anti-Stokes PL with a peak position at approximately 506 nm is identified, facilitated by resonant annihilation of three LO phonons, which yields $\Delta E \sim 3h\nu_{LO} > 4k_BT$ at room temperature ($h\nu_{LO} \sim 38$ meV[21]). Further analysis of the Stokes and anti-Stokes Raman spectra reveals that both the 1LO and 2LO anti-Stokes components are stronger than their Stokes counterparts, suggesting that multiple LO phonon annihilation dominates over creation process.

Based on the theory by Merlin et al.[22], the Huang-Rhys factor S is evaluated to quantify the electron-phonon coupling strength. FIG. 3(b) relates to FIG. 3(a) and shows a corresponding Huang-Rhys factor as a dependence on thickness. FIG. 3(b) depicts how S is significantly enhanced at the nanoscale[23], suggesting enhanced electron-phonon coupling in CdS nanobelts with a peak value of approximately 55 nm. This up-conversion is not due to a two-photon absorption in moderate laser power, analyzed from the linear dependence on excitation power of the anti-Stokes luminescence below 12 mW. Therefore, it is appreciated that the resonant annihilation of multiple LO phonons facilitates the up-conversion in CdS nanobelts due to a strong electron-LO phonon coupling.

FIG. 3(c) shows the excitation wavelength dependent PL spectra of the CdS nanobelt at 4.7 K when excited by lasers of five different wavelengths. Strong luminescence up-conversion can be sustained down to a liquid helium temperature. The main emission peaks involve a number of bound excitons and their phonon replica. An arrow labels the laser wavelength while a triangle labels the mean emission wavelengths for each spectrum evaluated from equation $$\overline{\nu}_f = \frac{\int \nu N(\nu) d\nu}{\int N(\nu) d\nu},$$

where N(ν) is the count of the luminescence photons at a certain frequency ν. The mean emission frequency corresponds to a mean energy $h\overline{\nu}_f$ where h is the Planck constant. The mean emission wavelength $\overline{\lambda}$ is defined as $$\overline{\lambda} = \frac{c}{\overline{\nu}_f},$$

where c is the speed of light. At 4.7 K, only 532 nm excitation leads to a blue-shifted mean emission. A temperature dependent PL revealed that donor-acceptor-pairs (DAP) emission emerges below 180 K. Consequently, DAP recombination dominates the luminescence spectra for 502 nm and 514 nm excitation (FIG. 3(c)), leading to a red-shifted PL that diminishes the laser cooling.

Figure 4:
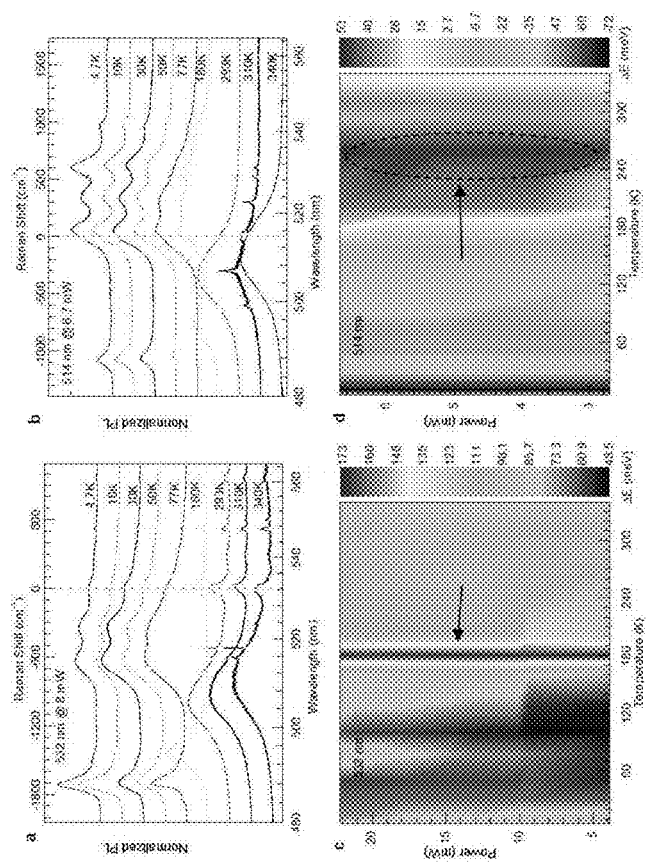
FIG. 4 shows a series of images relating to ΔE of the as-grown CdS nanobelt.

Next, the ΔE is evaluated systematically as a dependence on pump power and temperature. FIG. 4(a) shows anti-Stokes PL spectra taken from 4.7 K to 340 K with an excitation of 8.0 mW 532 nm laser. FIG. 4(b) shows anti-Stokes PL spectra of the same nanobelt excited by a 6.7 mW 514 nm laser. FIGS. 4(a) and 4(b) display the temperature evolution of anti-Stokes PL spectra at 532 (8.0 mW) and 514 nm (6.7 mW) laser excitation, respectively.

In FIG. 4(a), as the temperature is decreased from 340 K to 180 K, the PL peak gradually blue shifts. Below approximately 180 K, DAP emission becomes pronounced and both DAP and exciton emissions blue shift marginally. In FIG. 4(b), DAP emission peaks appear and dominate the spectra below 200 K. The spectra are offset vertically for clarity with vertical dash lines indicating the position of the pump lasers in FIGS. 4(a) and 4(b).

Both 532 nm and 514 nm can pump exciton emission located around 488 nm down to 4.7 K, exhibiting large blue shifts of 210 meV (>5$h\nu_{LO}$) and 130 meV (>3$h\nu_{LO}$), respectively. By extracting the mean emission frequency, $\Delta E = h\overline{\nu}_f(T) - h\nu$ surface plots can be obtained and displayed in FIGS. 4(c) and 4(d) respectively. FIG. 4(c) shows ΔE surface plot versus temperature and power for a 532 nm laser pumping while FIG. 4(d) shows ΔE surface plot versus temperature and pump power for a 514 nm laser pumping.

In FIG. 4(c), the maximum energy difference of approximately 173 meV is obtained around 180 K (as indicated by the arrow in FIG. 4(c)). Below 180 K, DAP emission peaks appear and lead to significant red shifts of the mean wavelength of luminescence. Further lowering the temperature, the intensity of the DAP peaks gradually increases which reduces ΔE further. Around 10 K, the bound exciton emission becomes much stronger and the ΔE increases again. With a further decrease of the temperature, the DAP emission appears and leads to the reduction of ΔE. In the whole temperature range being investigated, ΔE remains positive indicating that net cooling is possible at all the temperatures.

In FIG. 4(d), the maximum ΔE of approximately 52.5 meV is achieved around 200 K (as indicated by the arrow pointing to a zone in FIG. 4(d)). Below 200 K, the DAP peaks appear and dominate the emission, leading to the red shift of the mean wavelength of luminescence. Because the DAP energy levels resonate with the pump laser approximately, the DAP emission is much stronger than that of the exciton emission, which leads to the negative ΔE below 180 K, suggesting no net cooling is achievable by the 514 nm laser pumping. This conforms with cooling experiments which will be described in a later portion of the description. In the power ranges being investigated, no strong dependence of ΔE on power is observed, as manifested by the vertically striped bands in the surface plot. However, the net laser cooling is possible only below 12 mW because the two-photon process will dominate the process of luminescence up-conversion when much higher power is used.

Figure 5:
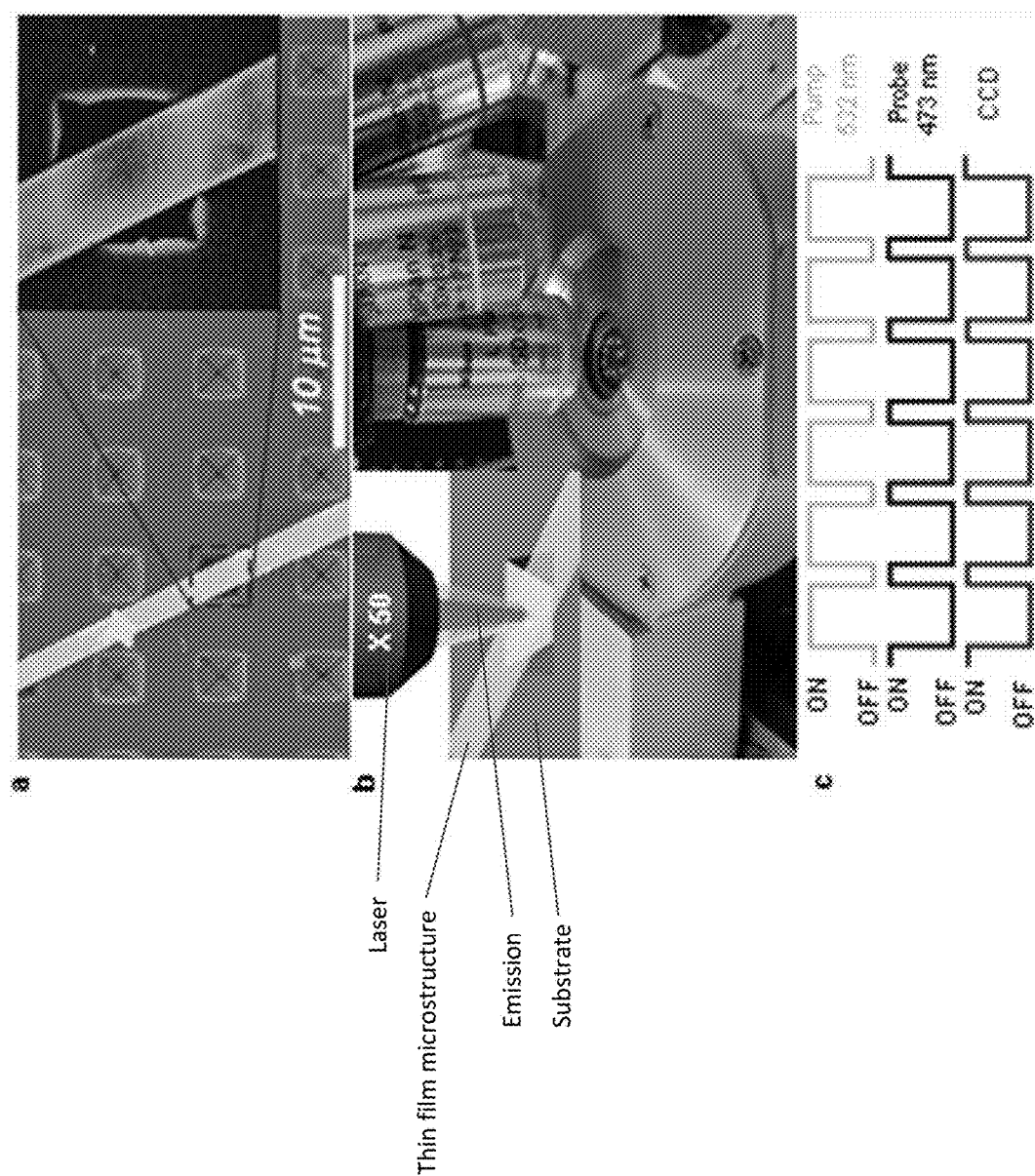
FIG. 5 shows a series of images relating to pump-probe luminescence thermometry ($P^2LT$) of the as-grown CdS nanobelt.

Pump-probe luminescence thermometry (P²LT) technique is employed to measure laser cooling as shown in FIG. 5. The concept relates to using temperature dependence of the Stokes PL peaks position as a non-contact local thermometry, essentially similar to differential luminescence thermometry[6]. In the laser cooling experiments, ΔT is sufficient for a high resolution spectrometer to detect cooling from the blue-shifting of the luminescence. To decrease thermal conduction of substrates/background absorption, and improve the luminescence escape efficiency, the CdS nanobelt is suspended across an inverted pyramid-shaped holes (approximately 3 μm width) etched by KOH on a SiO$_2$/Si substrate mounted on the cold finger of a continuous flow microscopy cryostat. FIG. 5(a) shows a scanning electron microscopy (SEM) image of a single CdS nanobelt suspended across holes etched on a SiO2/Si substrate. The inset shows an enlarged view of the CdS nanobelt.

A solid state 532 nm laser and Ar ion laser (514 nm, 502 nm and 488 nm) is used as a pump laser, while a 473 nm solid state laser is used as a probe beam to measure the cooling/heating effect. The probe beam of 473 nm is kept as low as 20 μW in order to eliminate laser heating effects. Both pump (Ar ion laser 488 nm, 502 nm and 514 nm, and Nd:YAG solid state 532 nm laser) and probe beams are collimated and focused through a 50× objective onto a single CdS nanobelt laid across the etched hole. FIG. 5(b) shows the experimental set-up with the two laser beams (pump and probe) aligned at the same spot. All the spectra of Raman, anti-Stokes PL and P$^2$LT were collected by a confocal triple grating spectrometer (Horiba-JY T64000) in a backscattering configuration. With a 640 mm focal length and 1800/mm grating, the spectral resolution is approximately 0.5/cm, corresponding to approximately 0.01 nm around 500 nm. The time sequence of pump, probe, and signal collection are shown in FIG. 5(c). The P$^2$LT spectra were acquired (acquisition time approximately 60 s) with a 5 min pumping interval after the pump beam was blocked. For every 5 min pumping (e.g., by 532 nm laser), the pump laser was blocked and the probe Stokes PL spectrum was acquired, excited by a 20 μW 473 nm laser.

In order to precisely determine the local temperature at the sample upon laser cooling, the peak position of the Stokes PL spectra as a function of an accurate sample temperature is required. This is achieved by accurately measuring the temperature of a copper cold finger of a continuous flow microscopy cryostat. The silicon substrate is glued onto the cold finger by GE varnish to ensure good thermal contact. The cold finger temperature can be precisely controlled by a Lakeshore temperature controller and accurately measured by a silicon diode temperature sensor, which is enclosed inside a radiation shielding box. Adequate waiting time is ensured to allow the system to reach a thermal equilibrium. The probe laser power is kept at a minimum to exclude possible local heating effects. Several Stokes PL spectra are taken to monitor the emission and to ensure that there is no visible peak shift occurred between sequential measurements, which confirm that the system reaches thermal equilibrium and the heat caused by the excitation laser is negligible.

Figure 6:
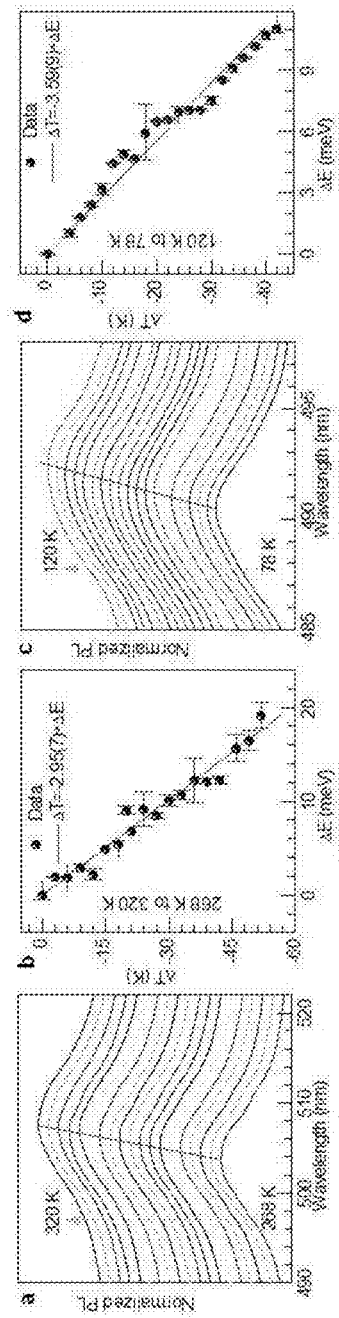
FIG. 6 shows a series of images relating to $P^2LT$ calibration spectra and curves showing laser cooling of the as-grown CdS nanobelt.

Two calibration spectra and two calibration curves are shown in FIG. 6, starting from 320 K (FIGS. 6(a) and (b)) and 120 K (FIGS. 6(c) and (d)), respectively. FIG. 6(a) shows the temperature dependence of the Stokes PL spectra excited by a 473 nm laser from 320 K to 268 K. Similarly, FIG. 6(c) shows the temperature dependence of Stokes PL spectra from 120 K to 78 K. The spectra are shifted vertically for clarity.

FIG. 6(b) shows the temperature differences versus peak shifts in energy, both referenced to 320 K, while FIG. 6(d) shows the temperature difference as a function of peak shift in energy, both referenced to 120 K.

For a starting temperature of 120 K, the exciton peak located at approximately 492 nm for calibration purposes (FIGS. 6(c) and (d)), because the exciton peak exhibits a higher sensitivity to temperature variation than DAP peaks located around 518 nm. Calibration curves FIGS. 6(b) and (d) are derived from FIGS. 6(a) and (c) respectively, plotted as temperature changes (referenced to their starting temperature 320 K and 120 K, respectively) versus the PL peak shift in energy (meV). Both calibration curves can be fitted linearly yielding the relation between the temperature difference and PL peak shift. This is a good approximation of the Varshni equation when the temperature range is small. Thus, these calibration curves are used to deduce the laser cooling temperature ΔT since this can be used as an intrinsic temperature calibration of the laser cooling.

Figure 7:
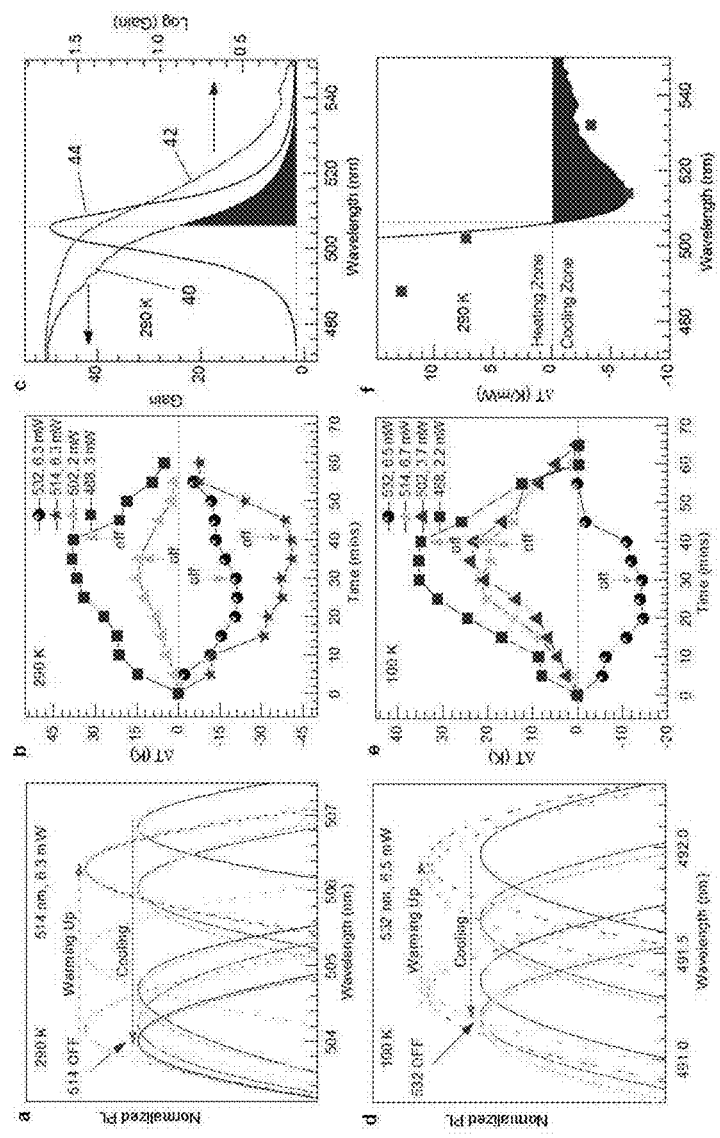
FIG. 7 shows a series of images relating to net laser cooling behavior of the as-grown CdS nanobelt.

FIGS. 7(a) and 7(d) display the Stokes PL evolution for a CdS nanobelt upon continuous 6.3 mW 514 nm (at 290 K) and 6.5 mW 532 nm (at 100 K) laser pumping respectively. In FIGS. 7(a) and 7(d), solid curves represent the cooling cycle, while the dashed curves represent the warming up after the pump laser is switched off. Dashed curves are shifted vertically for clarity. Each spectrum was obtained with a 5 minute interval during pumping, when the pump laser was blocked momentarily. A pronounced systematic blue shift upon laser pumping is attained until a steady state is reached in approximately 30-40 minutes, suggesting that a net cooling is established. After the cooling is stopped (switching off pump laser), the Stokes PL red shifts, indicating a rising temperature.

FIG. 7(b) displays calibration curves of temperature change ΔT versus time pumped by four laser lines (532, 514, 502 and 488 nm), with data extracted from FIG. 7(a) and the corresponding calibration curve around 290 K. FIG. 7(e) displays calibration curves of temperature change ΔT versus time pumped by four laser lines (532, 514, 502 and 488 nm), with data extracted from FIG. 7(d) and the corresponding calibration curve around 100 K. Based on the calibration curves in FIGS. 7(b) and 7(e), there is shown a net laser cooling of approximately 40 K and 20 K for 514 nm (at 290 K) and 532 nm (at 100 K) laser pumping, respectively. At 100 K, only 532 nm can lead to a net laser cooling of 15 K while 514 nm laser cannot due to the red shift of mean emission wavelength at 100 K as shown in FIGS. 4(b) and 4(d). 488 and 502 nm laser pumping leads to heating of the sample at all the temperatures. Although multiple LO phonon assisted up-conversion has been identified at cryogenic temperature down to 4.7 K (FIGS. 3(c), 4(a) and 4(b)), it is not possible to evaluate the laser cooling effect using current P$^2$LT techniques, since the exciton peak emission for sample below roughly 77 K shows a negligible dependence on temperature (FIGS. 4(a) and 4(b)).

The absorption at the band tail is crucial to evaluate the up-conversion and laser cooling. At the single nanobelt level, the direct measurement of optical absorption remains elusive. As such, a photoconductivity measurement is used to provide a direct approach to quantify the absorption[24].

FIG. 7(c) displays Photocurrent (PC) gain spectra (40), log(Gain) (42) and Stokes PL spectra (44) of a single CdS nanobelt device at 290 K. We find that at 532 nm, there is about 6% absorption compared to the maximum absorption around 480 nm. The darkened region corresponds to the laser cooling tail.

Based on the SB-E model and cooling power analysis, FIG. 7(f) shows measured maximum ΔT (squares) and theoretical calculated temperature change curve normalized to pump power in K/mW for different pump wavelengths at 290 K the normalized temperature change as a dependence on pumping laser wavelength at 290 K. The discrete data points provide an experimental temperature change ΔT in K/mW pumped by four different laser lines, in good agreement with theoretical analysis except for 488 nm. The darkened region highlights the cooling zone with 514 nm being the optimum cooling wavelength for 290 K.

Two underlying processes make net cooling impractical in GaAs-based semiconductors. They are high parasitic background absorption and low luminescence extraction efficiency, both of which lead to heating and represent the contemporary challenges not only in fundamental materials but also in device engineering in laser cooling[6-8]. The resonant annihilation of multiple LO phonons in CdS nanobelts leads to the removal of unprecedented >4 $k_BT$ at room temperature and >11 $k_BT$ at low temperature (180 K) in each cooling cycle. This means that the pump laser (e.g., 532 nm) moves to the Urbach tail of CdS, where the background absorption due to free carriers can no longer be ignored. Nonetheless, the earlier analysis shows that free carrier absorption in a CdS nanobelt is negligible. The luminescence extraction efficiency approaches unity due to the small thickness of the nanobelt. No emission on the lower energy side of 532 nm was observed, suggesting no background absorption contribution due to defects or surface recombination. Earlier data[25] and more in-depth analysis have revealed that radiative recombination decay lifetime is on the order of tens to hundreds of picoseconds, while the non-radiative decay lifetime is three orders of magnitude larger at room temperature and even more at low temperatures, justifying the nearly unity external quantum efficiency of >99% in CdS nanobelts based upon $\eta_{exe} = \eta_e W_{rad}/(\eta_e W_{rad} + W_{nr})$. A cooling efficiency of approximately 4.8% at 290 K and approximately 2.0% for 100 K are estimated from the above analysis for 532 nm pumping. The cooling power is estimated to be around 97 µW for 532 nm pumping at 290 K. The thermal conductive load is estimated to be about 80 µW, in good agreement with the cooling power. The radiative load of approximately 0.4 nW is negligible based on a black body model.

Proof of concept for the aforementioned theories will now be discussed in greater detail.

Figure 8:
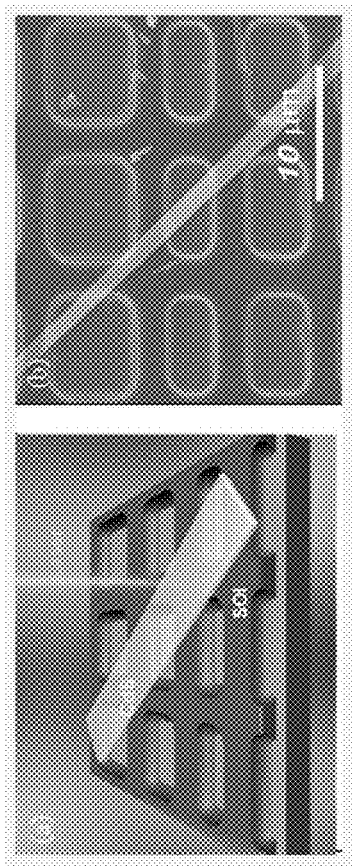
FIG. 8 shows various views of an all-solid-state cryocooler.

FIG. 8(a) discloses a digital illustration of an all-solid-state cryocooler, while FIG. 8(b) discloses an SEM image of the all-solid-state cryocooler. The all-solid-state crycooler consists of a single CdS nanobelt supported on a patterned SOI substrate. The SOI substrate is patterned with grids using e-beam lithography and etched by reactive ion etching. This is to decrease the thermal conductive loss and to provide a reference without a thermal load (suspended segment). The proof of concept is conducted from the frame portion, where the CdS nanobelt has good thermal contact (thermally anchored) with the crystalline Si top layer. The chip was mounted on a cold finger of a continuous flow microscopy cryostat to control the starting temperature and to keep the surrounding temperature constant. The ratio of the Stokes to anti-Stokes Raman signal from the Si top layer is used to determine the local temperature variation of the Si beneath the CdS nanobelt.

The cooling of the SOI substrate on which CdS nanobelts are dispersed is successfully achieved when pumped by a 4 mW 532 nm laser. The temperature is determined from the ratio of the intensities of the Stokes and anti-Stokes signals. It is well known that the intensity of both the Stokes and anti-Stokes is temperature dependent. If the Stokes and anti-Stokes intensities only depend on the phonon population, the temperature of the structures can be obtained from the following expression[26]:

$$\frac{I_{Stokes}}{I_{anti-Stokes}} = F\exp\left(\frac{\hbar\omega_0}{k_BT}\right)$$

where $I_{Stokes}$ and $I_{anti-Stokes}$ are Stokes and anti-Stokes intensities, $\hbar\omega_0$ is the phonon energy which is 65 meV at room temperature, F is a parameter depending on the materials and wavelength and $k_BT$ is the thermal energy. As the parameter F is a function of materials and wavelength, it needs to be obtained first in order to deduce the cooling temperature. F is determined by radiating the 100 µW 532 nm laser on silicon, which leads to 0.4896. For the cooling measurements, the 532 nm laser is used as both pump beam and probe beams for continually radiating the CdS nanobelt. For every 5 mins, the Raman signal from the silicon beneath the CdS nanobelt is acquired. Then the temperature of the silicon right beneath the CdS nanobelt is extracted from the ratio of the intensities of the Stokes and anti-Stokes signal based on the equation which was provided earlier:

$$\frac{I_{Stokes}}{I_{anti-Stokes}} = F\exp\left(\frac{\hbar\omega_0}{k_BT}\right).$$

Figure 9:
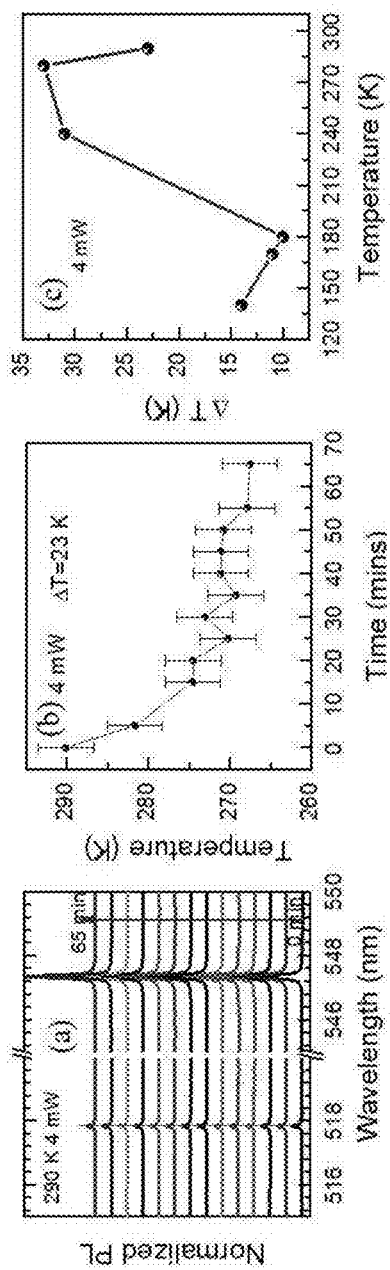
FIG. 9 shows a series of images relating to laser cooling of the all-solid-state cryocooler of FIG. 8.

FIG. 9(a) shows the Stokes and anti-Stokes evolution of Si upon continuous 4 mW 532 nm laser radiation. The temperature extracted from the Raman spectra is shown in FIG. 9(b) against pumping duration. It can be observed that the temperature gradually decreases from 290 K and it reaches a stable temperature of approximately 270 K after around 30 mins. The maximum temperature fall is 23 K.

A graph depicting starting temperature dependence of the maximum temperature fall under 4 mW 532 nm laser radiation is shown in FIG. 9(c). As the temperature decreases, the maximum temperature increases first and then decreases with a maximum value at 270 K. Below 180 K, the maximum temperature fall rises again. Two factors contribute to the maximum temperature fall, namely, the luminescence efficiency and the absorption. As the temperature decreases, the luminescence efficiency increases which would give a larger maximum temperature fall. However, the absorption decreases as the temperature decreases because the band edge shifts further away from the pumping laser. The competition between those two factors causes the largest maximum temperature fall at 270 K and the smallest maximum temperature fall appearing at 180 K. Below 180 K, the presence of the DAP emission gives rise to the redshift of the mean emission energy, which leads to the increase of the absorption again. Therefore, the maximum temperature fall gradually increases again as shown in FIG. 9(c).

Figure 10:
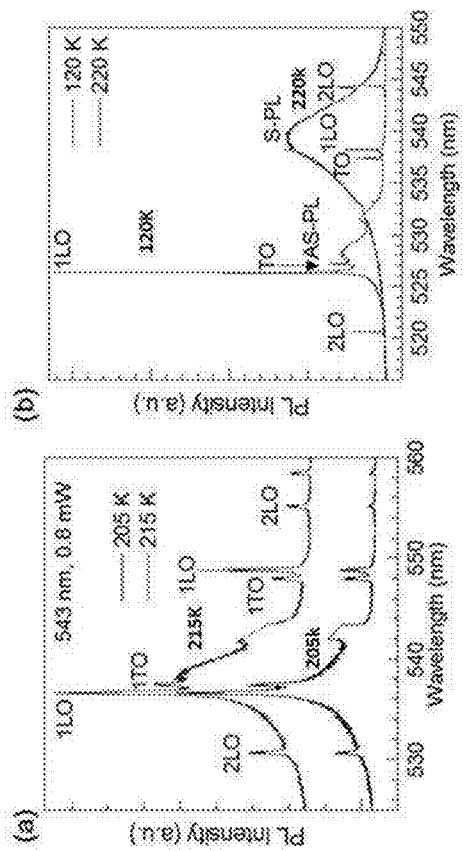
FIG. 10 shows a series of images relating to laser cooling of a ZnTe nanobelt.

Other than CdS, ZnTe is another II-VI semiconductor with strong electron-phonon coupling and also provides a very strong multi-phonon assisted anti-Stokes PL emission. FIG. 10(a) shows the anti-Stokes PL process at two different temperatures excited by 543 nm laser for ZnTe. A clear phonon assisted behavior can be seen from the spectra. By changing the sample temperature, transition energy of exciton can be tuned to be resonant with anti-Stoke PL process. This will make the phonon annihilation (cooling) process much faster than the phonon creation process (heating), thus leading to more efficient cooling. FIG. 10(b) shows Stokes PL and anti-Stokes PL emission evolution at two different temperatures at 532 nm laser excitation. Controlling the sample temperature enables control/switching of the cooling or heating process.

Figure 11:
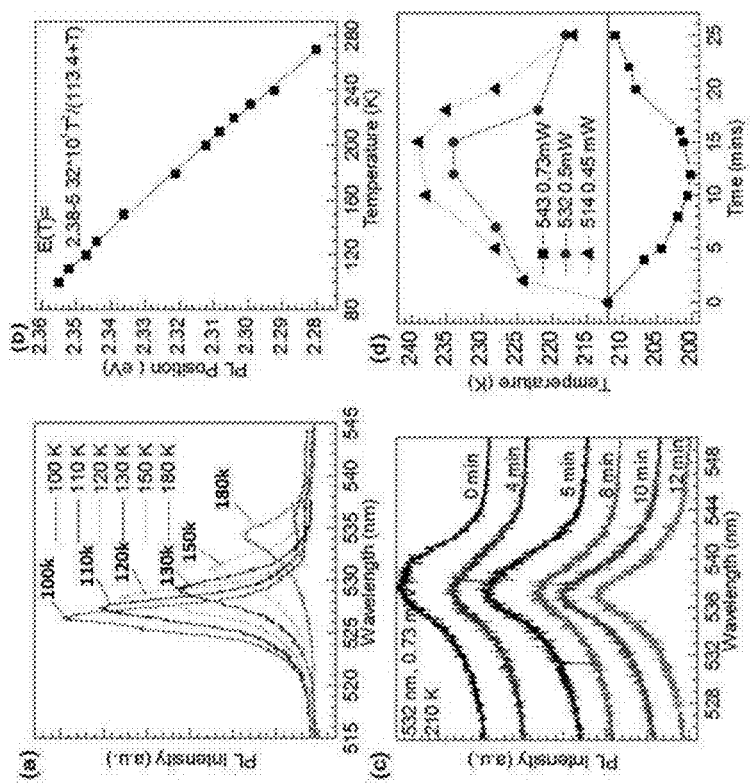
FIG. 11 shows a further series of images relating to laser cooling of the ZnTe nanobelt.

The same P²LT method is also used for cooling experiments. The peak shift-temperature relation is calibrated by monitoring the PL spectra at different samples temperature. Then this relation is used to measure the cooling temperature in cooling experiments. Starting from 210 K and pumping by 543 nm laser of 0.73 mW, an approximately 10 K net laser cooling for about 13 minutes pumping was observed. When changing the pump lasers (532 and 514 nm) to Stokes side of PL spectra, heating effects were observed. The heating and cooling phenomena depending on the pump wavelength are a solid evidence of laser cooling in ZnTe nanobelts. FIG. 11(a) shows the calibrated spectra depending on the temperature. The excitation wavelength is 473 nm with 50 mW in order to avoid the laser heating effect. FIG. 11(b) shows the peak position vs temperature. The fitting function will be used to determine the sample temperature in cooling experiments. FIG. 11(c) shows the typical spectra evolution probed by 473 nm laser with pumping time in cooling experiments, the pumping wavelength being 532 nm and power being 0.73 mW. A blue-shift is clearly observed which indicates net laser cooling is achieved. FIG. 11(d) shows cooling results for different pump laser starting from 210 K where only 543 nm laser gives an approximately 10 K cooling while others result in heating effects. For both cooling and heating, the thermal balance time is about 13 minutes.

Figure 12:
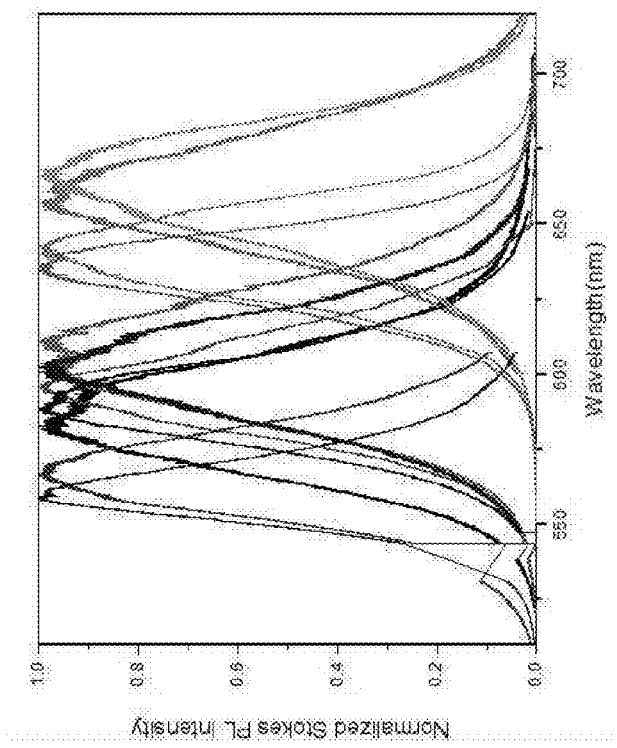
FIG. 12 shows a normalized Stokes PL spectra of a $CdS_xSe_{1-x}$ nanobelt.

Besides the aforementioned binary compound semiconductors of CdS and ZnTe, ternary compound semiconductors such as $CdS_xSe_{1-x}$ are very important materials because their bandgap (thus the PL wavelength) can be continuously tuned by controlling the ratio of x. At the same time, these materials keep the strong electron-phonon coupling properties of binary compound. FIG. 12 shows normalised Stokes PL spectra of $CdS_xSe_{1-x}$, where each line represents a different ratio x. All of PL peaks from all samples fall in the gap between the peaks of CdS (512 nm) and CdSe (708 nm), indicating successful alloying.

Figure 13:
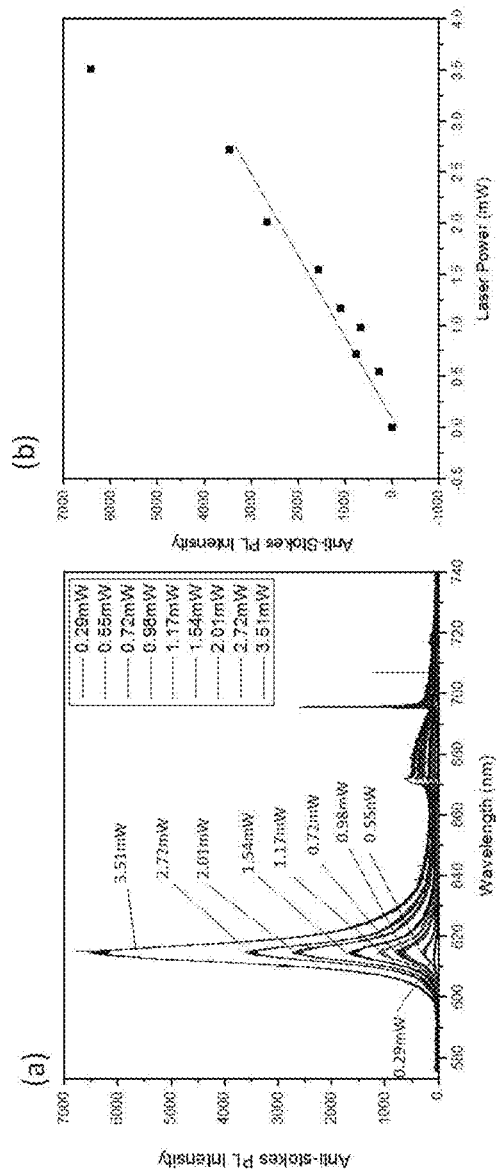
FIG. 13 shows a series of images relating to cooling potentials of the $CdS_xSe_{1-x}$ nanobelt.

Anti-Stokes PL experiments are carried out in order to investigate the cooling potentials of ternary alloy $CdS_xSe_{1-x}$. FIG. 13(a) shows anti-Stokes PL spectra of $CdS_xSe_{1-x}$ excited by 671 nm laser with different power at 77 K. A ratio of x=0.5 is selected as a example to show the possibility of anti-Stokes PL process. A strong anti-Stokes emission was observed with extremely large energy blueshift of approximately 170 meV at 77 K. In order to determine if two-photons absorption (TPA) contributes the anti-Stokes up-conversion, a graph of exciton intensity vs laser power is plotted as shown in FIG. 13(b). Below 3 mW excitation of 671 nm laser, a linear dependence of anti-Stokes PL intensity with the laser power is shown. It means that the TPA process can be excluded from this up-conversion. Although the more detail cooling experiments may be done, the preliminary data as shown in FIG. 13 indicates that $CdS_xSe_{1-x}$ has good potential for laser cooling.

Figure 14:
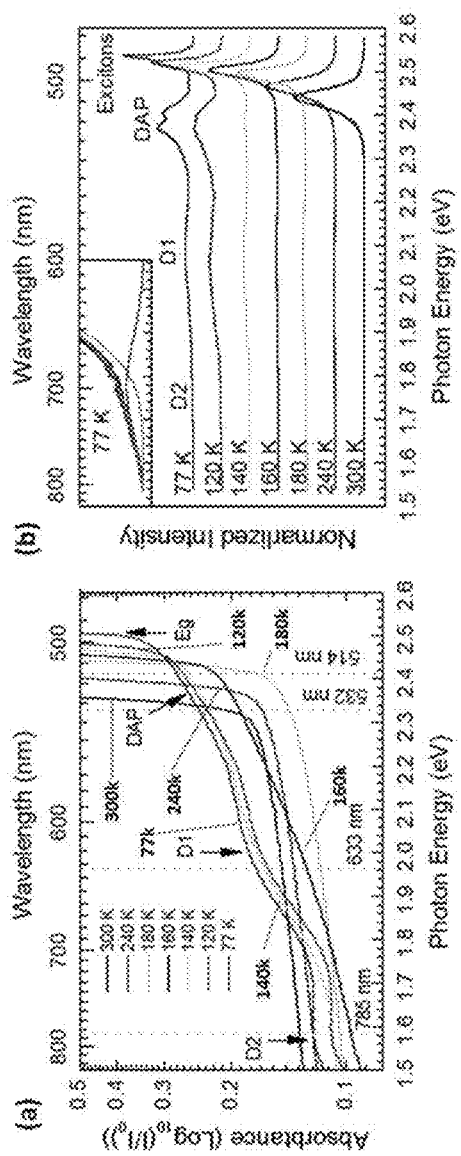
FIG. 14 shows a series of images relating to absorption and Stokes PL spectra of a CdS bulk crystal.

Thus far, laser cooling has only been discussed in relation to nanostructures. In real/practical applications, such as, for example, using a semiconductor to cool either another CCD sensor or infrared detector, a larger structure having similar size as the cooling targets would be necessary. Therefore, attaining laser cooling in bulk semiconductor is a key step towards a semiconductor optical cryocooler. The challenges of laser cooling in bulk structures is a need for high crystalline quality samples without any defects emission below the excitation energy, because such lower energy emission contributes to heating. FIG. 14(a) shows the absorption spectra of a CdS bulk crystal (which is commercially available) from 300 K to 77 K. FIG. 14(b) shows the PL spectra of a CdS bulk crystal (which is commercially available) from 300 K to 77 K. Besides the excitons and DAP emission, two low energy defects emission labelled as D1 and D2 are noted, which is from intermediate and anti-site defects respectively. Thus, the defects emissions rise at low temperature.

Figure 15:
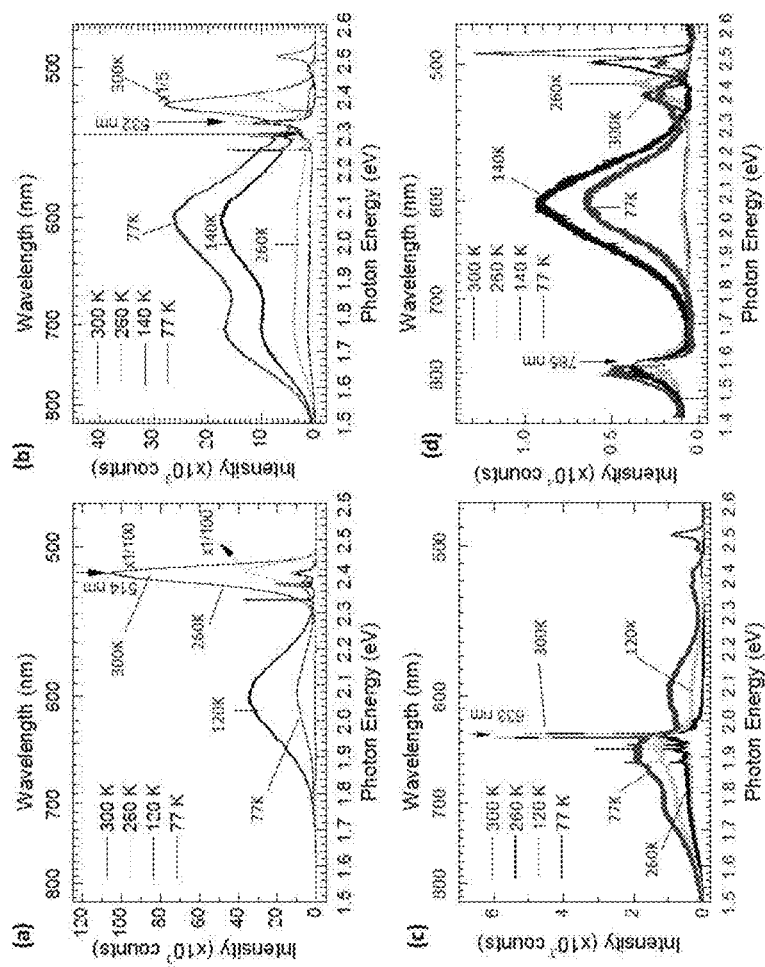
FIG. 15 shows a series of images relating to anti-Stokes PL spectra excitation by different lasers from 300 K to 77 K for the CdS bulk crystal.

In order to ascertain cooling potential, the anti-Stokes PL of bulk CdS crystal is measured at different temperature and different laser wavelength excitation. FIG. 15(a) shows anti-Stokes PL spectra excitation by 514 nm laser, FIG. 15(b) shows anti-Stokes PL spectra excitation by 532 nm laser, FIG. 15(c) shows anti-Stokes PL spectra excitation by 633 nm laser while FIG. 15(d) shows anti-Stokes PL spectra excitation by 785 nm laser. It is observed that the anti-Stokes emission of exciton and DAP is very strong, and this is desirable for laser cooling. However, the defects emission from the deep level D1 and D2 contribute towards heating (proportional to the integrated intensity, peak area of D1 and D2). Thus, once the D1 and D2 defects levels are removed, net laser cooling is possible. In modern growth techniques of semiconductor bulk crystal such as, for example, metal organic chemical vapor deposition (MOCVD), fusion method and so forth, the defects can be managed and removed by controlling the crystallizing process and growth parameters.

In view of the aforementioned, net laser cooling can be carried out in semiconductors. The net laser cooling in the CdS nanobelts can be attributed to the large energy difference $\Delta E$ between the pump laser and the mean emission energy due to the multiple LO phonon annihilation before carrier thermalization, the near unity emission extraction efficiency due to the small thickness of the nanoblets and the high crystalline quality proved by the absence of the defect emission below the pump wavelength. The cooling of other thermal load SOI anchored to the CdS nanobelts is realized as well. Thus, the findings leads to the capability of designing materials for the laser cooling of semiconductors with strong electron LO phonon coupling such as other II-VI materials in the thin film or nanomaterials morphology.

The preceding description demonstrates for the first time a substantial net laser cooling of approximately 40 K at 290 K pumping by a 514 nm laser, and approximately 15 K at 100 K pumping by a 532 nm laser for CdS nanobelts. Compared to III-V GaAs-based quantum wells, much larger energy can be removed during each cooling cycle, while still having higher extraction efficiency and comparable external quantum efficiency. A high cooling efficiency of 4.8% and approximately 97 µW cooling power are obtained pumped by 532 nm at 290 K. Cooling another thermal load such as SOI substrates which is thermally anchored to CdS nanobelt have been demonstrated. In this regard, designing materials for the laser cooling of semiconductors with strong electron LO phonon coupling is possible.

The invention aims at realizing the all-solid-state cryocooler. Advantages of compactness, vibration- and cryogen-free, high reliability and low achievable cooling temperature, leads the all-solid-state semiconductor cryocooler to be a credible alternative to the conventional thermoelectric and mechanical cooler especially for some special applications such as spaceborne and athermal laser, especially since the thermoelectric and mechanical cooler cannot be used. The small size of the CdS nanobelt cryocooler can be easily integrated into the nano-scale electric and optoelectric devices, which would definitely boost the development of the nano-electric and optoelectric devices, while the CdS thin film cryocooler is able to readily extend the nano-scale cooler to the macro-scale applications. In addition, coupling the CdS cryocooler with thermoelectric materials can be used as energy harvester in a changing and unstable environment such as might be expected for mobile or fixed autonomous micro systems.

Figure 16:
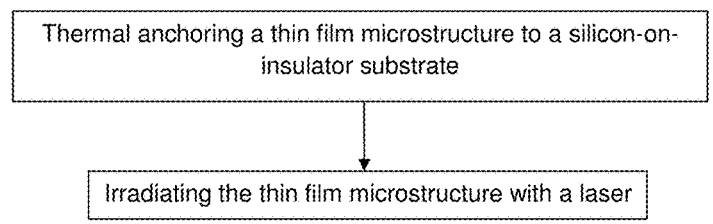
FIG. 16 shows the steps associated with the method for carrying out laser cooling.
Figure 17:
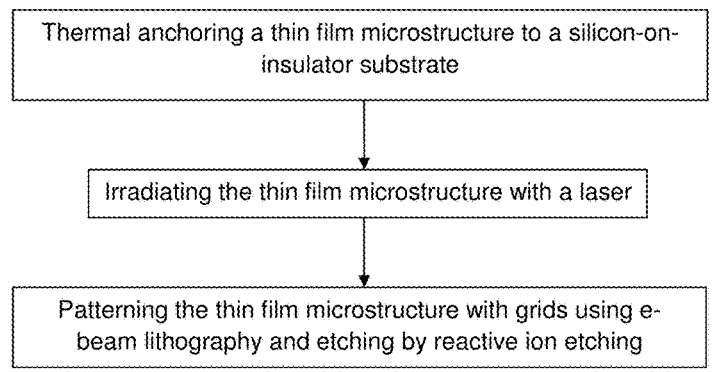
FIG. 17 shows the steps associated with the method for carrying out laser cooling and patterning.

FIGS. 16-17 summarize the steps associated with the method for carrying out laser cooling. As a first step, thermal anchoring a thin film microstructure to a silicon-on-insulator substrate was performed. In a second step, the thin film microstructure was irradiated with a laser. In a third step, the laser irradiated thin film microstructure was patterned with grids using e-beam lithograph and etching by reactive ion etching.

Whilst there has been described in the foregoing description preferred embodiments of the present invention, it will be understood by those skilled in the technology concerned that many variations or modifications in details of design or construction may be made without departing from the present invention.

REFERENCES

1 Chu, S., Cohen-Tannoudji, C. & Philips, W. D. For development of methods to cool and trap atoms with laser light. Nobel Prize in Physics, http://nobelprize.org, (1997).

2 Cornell, E. A., Ketterle, W. & Weiman, C. E. For the achievement of Bose-Einstein condensation in dilute gases of alkali atoms, and for early fundamental studies of the properties of the condensates. Nobel Prize in Physics, http://nobelprize.org, (2001).

3 Vogl, U. & Weitz, M. Laser cooling by collisional redistribution of radiation. Nature 461, 70-73, (2009).

4 Pringsheim, P. Zwei Bemerkungen über den Unterschied von Lumineszenz-und Temperaturstrahlung. Z. Phys. A 57, 739-746, (1929).

5 Sheik-Bahae, M. & Epstein, R. I. Optical refrigeration. Nature Photon. 1, 693-699, (2007).

6 Sheik-Bahae, M. & Epstein, R. I. Laser cooling of solids. Laser Photon. Rev. 3, 67-84, (2009).

7 Nemova, G. & Kashyap, R. Laser cooling of solids. Rep. Prog. Phys. 73, 086501, (2010).

8 Epstein, R. I. & Sheik-Bahae, M. Optical Refrigeration. (Wiley-VCH Verlag GmbH & Co. KGaA, 2009).

9 Epstein, R. I. et al. Observation of laser-induced fluorescent cooling of solid. Nature 377, 500-503, (1995).

10 Seletskiy, D. V. et al. Laser cooling of solids to cryogenic temperatures. Nature Photon. 4, 161-164, (2010).

11 Rivlin, L. A. & Zadernovsky, A. A. Laser cooling of semiconductors. Opt. Commun. 139, 219-222, (1997).

12 Rupper, G., Kwong, N. H. & Binder, R. Large excitonic enhancement of optical refrigeration in semiconductors. Phys. Rev. Lett. 97, 117401, (2006).

13 Sheik-Bahae, M. & Epstein, R. I. Can laser light cool semiconductors? Phys. Rev. Lett. 92, 247403, (2004).

14 Eshlaghi, S., Worthoff, W., Wieck, A. D. & Suter, D. Luminescence upconversion in GaAs quantum wells. Phys. Rev. B 77, 245317, (2008).

15 Imangholi, B. et al. Effects of epitaxial lift-off on interface recombination and laser cooling in GaInP/GaAs heterostructures. Appl. Phys. Lett. 86, 081104, (2005).

16 Finkeissen, E. et al. Cooling of a semiconductor by luminescence up-conversion. Appl. Phys. Lett. 75, 1258-1260, (1999).

17 Gauck, H. et al. External radiative quantum efficiency of 96% from a GaAs/GaInP heterostructure. Appl. Phys. A-Mater. Sci. Process. 64, 143-147, (1997).

18 Rupper, G., Kwong, N. H. & Binder, R. Theory of semiconductor laser cooling at low temperatures. Phys. Status Solidi C 3, 2489-2493, (2006).

19 Rupper, G., Kwong, N. H. & Binder, R. Optical refrigeration of GaAs: Theoretical study. Phys. Rev. B 76, 245203, (2007).

20 Khurgin, J. B. Surface plasmon-assisted laser cooling of solids. Phys. Rev. Lett. 98, 177401, (2007).

21 Madelung, O., Rössler, U. & Schulz, M. Landolt-Bornstein, Group III: Condensed Matter. Semiconductors: II-VI and I-VII compounds, Vol. 41B. (Springer, 1999).

22 Merlin, R. et al. Multiphonon provesses in YbS. Phys. Rev. B 17, 4951-4958, (1978).

23 Zhang, Q. et al. Exciton-phonon coupling in individual ZnTe nanorods studied by resonant Raman spectroscopy. Phys. Rev. B 85, 085418, (2012).

24 Li, D. H., Zhang, J., Zhang, Q. & Xiong, Q. H. Electric Field-Dependent Photoconductivity in CdS Nanowires and Nanobelts: Exciton ionization, Franz-Keldysh and Stark Effects. Nano Lett. 12, 2993, (2012).

25 Xu, X. et al. Dynamics of bound exciton complexes in CdS nanobelts. ACS Nano. 5, 3660-3669, (2011).

26 Jellison, G. E., Jr., Lowndes, D. H. & Wood, R. F. Importance of temperature-dependent optical properties for Raman-temperature measurements for silicon. Physical Review B 28, 3272-3276, (1983).

The invention claimed is:

1. An apparatus for laser cooling a silicon-on-insulator substrate, the apparatus including:
   a laser for providing an emission;
   a silicon-on-insulator substrate; and
   a thin film microstructure thermally anchored to the silicon-on-insulator substrate, the thin film microstructure being made from a material selected from either a II-VI binary compound semiconductor or a II-VI ternary compound semiconductor,
   wherein the apparatus being arranged such that the emission is incident on the thin film microstructure, the emission having a wavelength corresponding to an energy below a band gap of the thin film microstructure.

2. The laser cooling apparatus as claimed in claim 1, wherein the thin film microstructure is in a form selected from a group consisting of: nanobelts, crystalline thin film and bulk crystal.

3. The laser cooling apparatus as claimed in claim 1, wherein the thin film microstructure is made from a II-VI binary compound semiconductor and the II-VI binary compound semiconductor is selected from a group consisting of: cadmium sulfide, cadmium selenide, cadmium telluride, zinc sulfide, zinc selenide and zinc telluride.

4. The laser cooling apparatus as claimed in claim 1, wherein the thin film microstructure is made from a II-VI ternary compound semiconductor and the II-VI ternary compound semiconductor is selected from a group consisting of: $CdS_xSe_{1-x}$, $CdS_xTe_{1-x}$, $CdSe_xTe_{1-x}$, $ZnS_xSe_{1-x}$, $ZnS_xTe_{1-x}$, and $ZnSe_xTe_{1-x}$.

5. The laser cooling apparatus as claimed in claim 1, wherein the silicon-on-insulator substrate is patterned with grids by e-beam lithography, and etched by reactive ion etching.

6. The laser cooling apparatus as claimed in claim 1, wherein the laser has a power rating of less than 12 mW.

7. The laser cooling apparatus as claimed in claim 1, wherein the thin film microstructure is configured to provide high emission extraction in an absence of reabsorption.

8. A nano-electric device comprising the laser cooling apparatus as claimed in claim 1.

9. An optoelectric device comprising the laser cooling apparatus as claimed in claim 1.

10. A method for carrying out laser cooling of a silicon-on insulator-substrate, the method including:
   thermal anchoring a thin film microstructure to a silicon-on-insulator substrate, the thin film microstructure being made from a material selected from either a II-VI binary compound semiconductor or a II-VI ternary compound semiconductor; and
   irradiating the thin film microstructure with an emission from a laser, the emission having a wavelength corresponding to an energy below a band gap of the thin film microstructure.

11. The method as claimed in claim 10, further including patterning the silicon-on-insulator substrate with grids using e-beam lithography, and etching by reactive ion etching.

12. The method as claimed in claim 11, wherein the thin film microstructure is in a form selected from a group consisting of: nanobelts, crystalline thin film and bulk crystal.

13. The method as claimed in claim 10, wherein the thin film microstructure is in a form selected from a group consisting of: nanobelts, crystalline thin film and bulk crystal.

\* \* \* \* \*